(12) United States Patent  
Ikegawa et al.

(10) Patent No.: US 8,962,495 B2  
(45) Date of Patent: Feb. 24, 2015

(54) FILM DEPOSITION METHOD

(71) Applicant: Tokyo Electron Limited, Tokyo (JP)

(72) Inventors: Hiroaki Ikegawa, Iwate (JP); Masahiko Kaminishi, Iwate (JP); Yoshinobu Ise, Iwate (JP); Jun Ogawa, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/915,716

(22) Filed: Jun. 12, 2013

(65) Prior Publication Data

US 2013/0337658 A1    Dec. 19, 2013

(30) Foreign Application Priority Data

Jun. 14, 2012  (JP) .................................. 2012-135150

(51) Int. Cl.  
    *H01L 21/02*    (2006.01)  
    *C23C 16/40*    (2006.01)  
    *C23C 16/455*    (2006.01)  
    *H01L 21/687*    (2006.01)

(52) U.S. Cl.  
    CPC ............ *H01L 21/0262* (2013.01); *C23C 16/40* (2013.01); *C23C 16/402* (2013.01); *C23C 16/403* (2013.01); *C23C 16/405* (2013.01); *C23C 16/45519* (2013.01); *C23C 16/45551* (2013.01); *H01L 21/68764* (2013.01)  
    USPC .......................................... 438/782; 118/719

(58) Field of Classification Search  
    None  
    See application file for complete search history.

(56) References Cited

U.S. PATENT DOCUMENTS

| 2007/0234957 A1* | 10/2007 | Lee et al. ...................... 118/715 |
| 2009/0324826 A1* | 12/2009 | Kato et al. ................ 427/255.28 |
| 2010/0055319 A1* | 3/2010 | Kato et al. ................ 427/255.28 |
| 2010/0272895 A1* | 10/2010 | Tsuda ....................... 427/255.32 |
| 2011/0236598 A1* | 9/2011 | Kumagai et al. .............. 427/569 |

FOREIGN PATENT DOCUMENTS

JP            4661990            3/2011

* cited by examiner

*Primary Examiner* — Charles Garber  
*Assistant Examiner* — Alia Sabur  
(74) *Attorney, Agent, or Firm* — IPUSA, PLLC

(57) ABSTRACT

A film deposition method includes a first step and a second step. In the first step, a first reaction gas is supplied from a first gas supply part to a first process area, and a second reaction gas capable of reacting with the first reaction gas is supplied from a second gas supply part to a second process area, while rotating a turntable and supplying a separation gas to separate the first process area and the second process area from each other. In the second step, the second reaction gas is supplied from the second gas supply part to the second process area without supplying the first reaction gas from the first gas supply part for a predetermined period, while rotating the turntable and supplying the separation gas to separate the first process area and the second process area from each other.

3 Claims, 7 Drawing Sheets

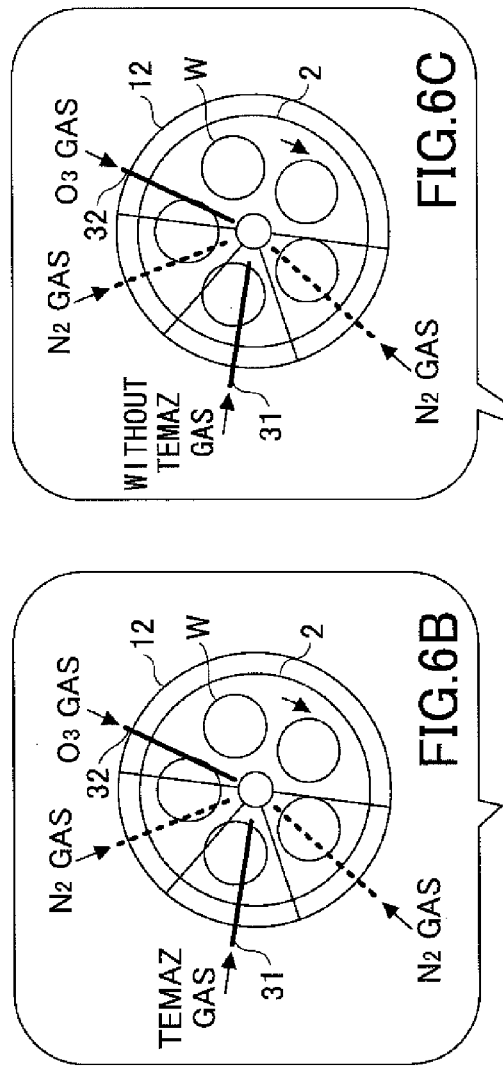
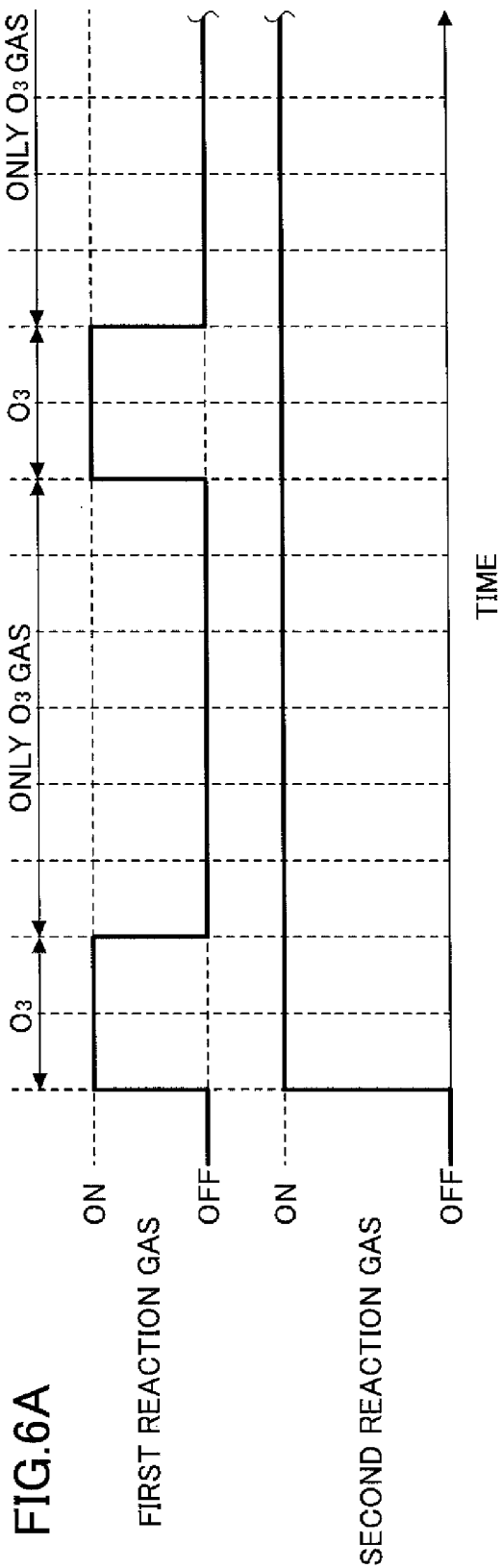

FILM DEPOSITION METHOD

CROSS-REFERENCE TO RELATED APPLICATIONS

This patent application is based upon and claims the benefit of priority of Japanese Patent Application No. 2012-135150, filed on Jun. 14, 2012, the entire contents of which are incorporated herein by reference.

BACKGROUND OF THE INVENTION

1. Field of the Invention

The present invention relates to a film deposition method that deposits a reaction product of at least two kinds of reaction gases that react with each other by alternately supplying the gases onto the substrate, and more specifically to a film deposition method appropriate for filling a concave portion formed in a surface of the substrate with the reaction product.

2. Description of the Related Art

A process of fabricating a semiconductor integrated circuit (i.e., IC) includes a process of depositing a thin film on a semiconductor wafer. With respect to this process, improvement of uniformity within a surface of the wafer is desired to answer demands for further miniaturization of the IC. A deposition method called an atomic layer deposition (ALD) method or a molecular layer deposition (MLD) method is expected to respond to such demands. In the ALD method, by repeating a cycle of adsorbing one reaction gas (e.g., a reaction gas A) of two kinds of reaction gases that react with each other on a surface of a wafer, and of reacting the other reaction gas (e.g., a reaction gas B) with the adsorbed reaction gas A, a thin film made of the reaction product is deposited on the wafer. The ALD method has advantages of having superior film thickness uniformity and film thickness controllability for utilizing adsorption of the reaction gases on the surface of the wafer.

There is a turntable-type film deposition apparatus as one of the film deposition apparatuses that implement the ALD method, as disclosed in Japanese Patent No. 4661990. This film deposition apparatus includes a turntable rotatably provided in a vacuum chamber and on which a plurality of wafers is placed, a separation area separating a supply area of the reaction gas A and a supply area of the reaction gas B that are zoned above the turntable, evacuation openings provided respectively corresponding to the supply areas of the reaction gases A and B, and an evacuation device connected to these evacuation openings. In such a film deposition apparatus, the wafer passes through the supply area of the reaction gas A, the separation area, the supply area of the reaction gas B, and the separation area in sequence. This allows the reaction gas A to be adsorbed on the surface of the wafer in the supply area of the reaction gas A, and the reaction gas B to react with the reaction gas A on the wafer and in the supply area of the reaction gas B. Because of this, the reaction gas A and the reaction gas B do not have to be switched during the deposition, and can be supplied continuously. Accordingly, an evacuation/purge process is not required, which can advantageously reduce deposition time.

However, sometimes the reaction gas B cannot sufficiently react with the reaction gas A while the wafer passes the supply area of the reaction gas B. For example, when reactivity of the reaction gas A with the reaction gas B is low, a thin film may be deposited while leaving the reaction insufficient. Such a thin film contains a lot of unreacted molecular species or unbonded valance electrons, which may unfortunately deteriorate the deposited thin film. Moreover, when depositing a substance that widely changes its properties according to a deviation from stoichiometric composition of the reaction product, a problem of not being able to make the properties uniform may be caused.

SUMMARY OF THE INVENTION

Embodiments of the present invention provide a novel and useful film deposition method solving one or more of the problems discussed above.

More specifically, embodiments of the present invention provide a film deposition method that can sufficiently react two or more kinds of reaction gases with each other in a film deposition method that deposits a reaction product of the two or more kinds of reaction gases on a substrate by alternately supplying the two or more kinds of reaction gases that react with each other onto the substrate.

According to one embodiment of the present invention, there is a film deposition method using a film deposition apparatus. The film deposition apparatus includes a turntable rotatably provided in a vacuum chamber, and the turntable includes a substrate loading area in an upper surface to hold a substrate thereon. The film deposition apparatus further includes a first gas supply part arranged in a first process area zoned above the upper surface of the turntable and configured to supply a gas onto the upper surface of the turntable, a second gas supply part arranged in a second process area distanced from the first process area along a circumferential direction of the turntable and configured to supply a gas onto the upper surface of the turntable, a separation gas supply part provided between the first process area and the second process area in the vacuum chamber and configured to supply a separation gas onto the upper surface of the turntable, and a separation area including a ceiling surface configured to form a narrow space relative to the upper surface of the turntable in order to introduce the separation gas from the separation gas supply part to the first process area and the second process area. The ceiling surface has a width along the circumferential direction of the turntable, the width broadening with distance from the center of the turntable in a radial direction of the turntable. The film deposition method includes a first step and a second step. In the first step, a first reaction gas is supplied from the first gas supply part to the first process area, and a second reaction gas capable of reacting with the first reaction gas is supplied from the second gas supply part to the second process area, while rotating the turntable and supplying the separation gas from the separation gas part to separate the first process area and the second process area from each other. In the second step, the second reaction gas is supplied from the second gas supply part without supplying the first reaction gas from the first gas supply part for a predetermined period, while rotating the turntable and supplying the separation gas from the separation gas part to separate the first process area and the second process area from each other.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIGS. 6A through 6C are a time chart for illustrating a film deposition method of an embodiment of the present invention.

DETAILED DESCRIPTION OF THE PREFERRED EMBODIMENTS

Figure 1:
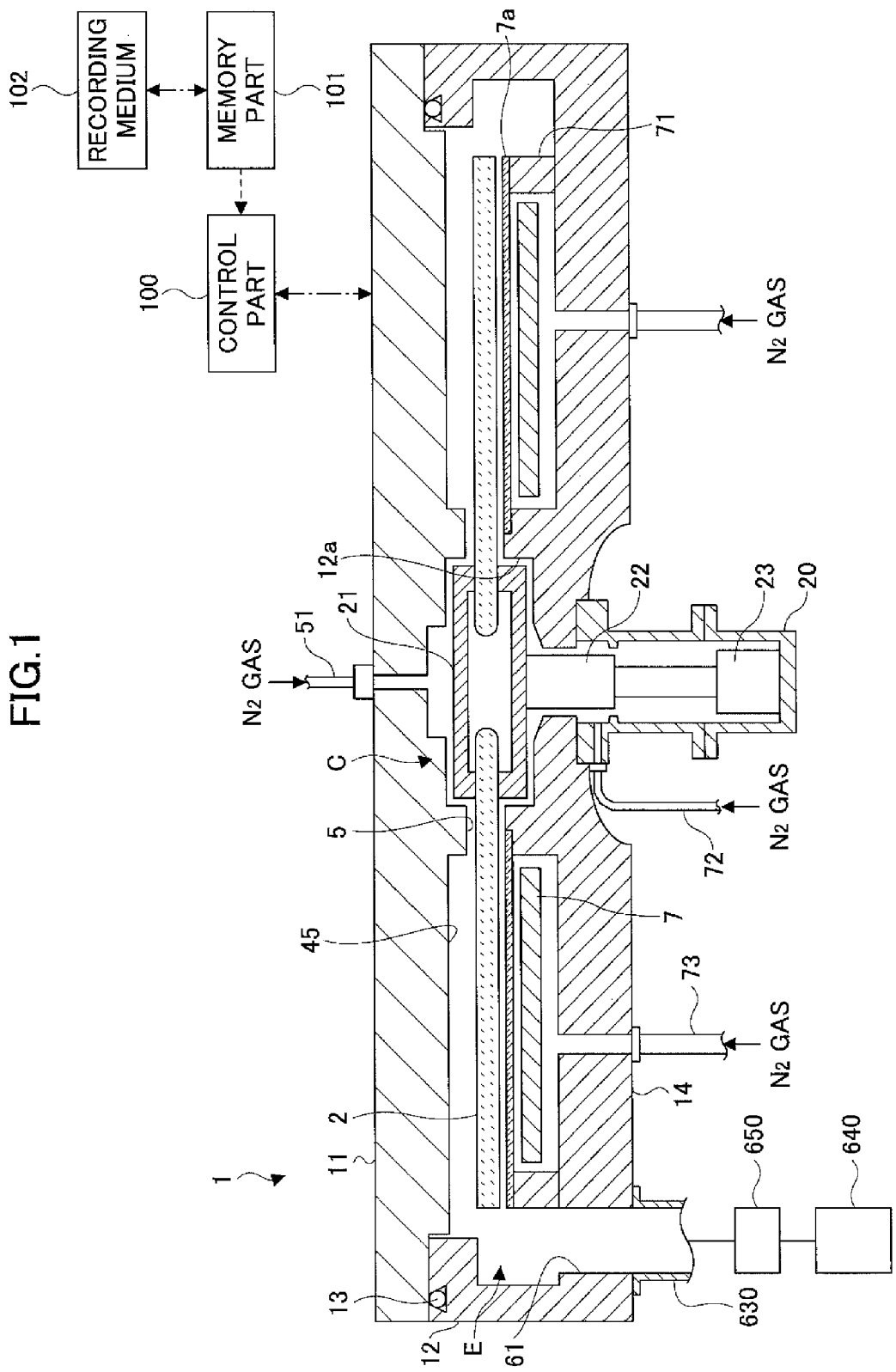
FIG. 1 is a cross-sectional view illustrating a film deposition apparatus preferable to implement a film deposition method of an embodiment of the present invention.

A description is given below, with reference to accompanying drawings of non-limiting, exemplary embodiments of the present invention. In the drawings, the same or corresponding reference marks are given to the same or corresponding members or components. It is noted that the drawings are illustrative of the invention, and there is no intention to indicate scale or relative proportions among the members or components, alone or therebetween. Therefore, the specific thickness or size should be determined by a person having ordinary skill in the art in view of the following non-limiting embodiments.

<Film Deposition Apparatus>

To begin with, a description is given below of a preferred film deposition apparatus to implement a film deposition method of an embodiment of the present invention.

Figure 2:
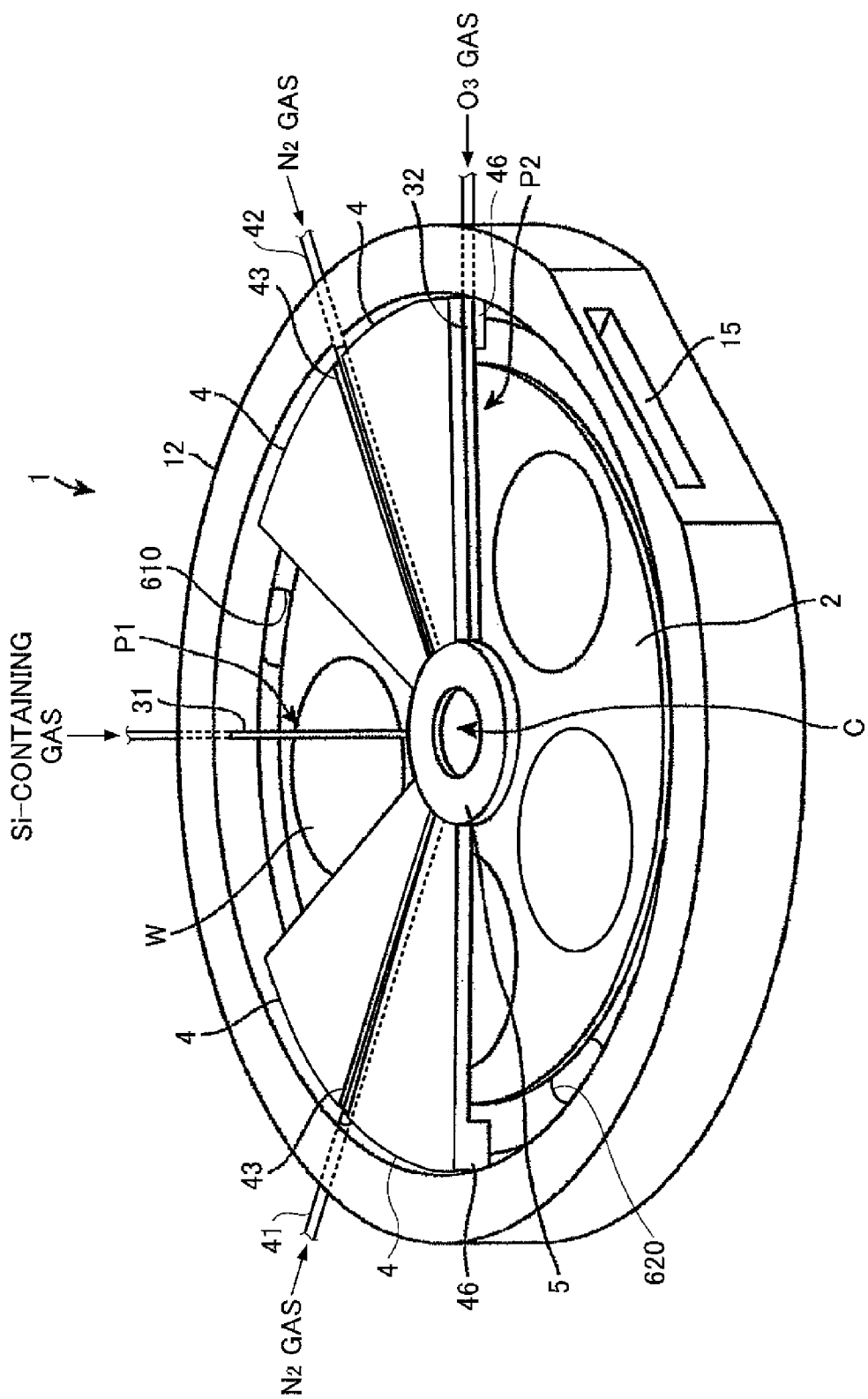
FIG. 2 is a perspective view illustrating a structure in a vacuum chamber of the film deposition apparatus in FIG. 1.
Figure 3:
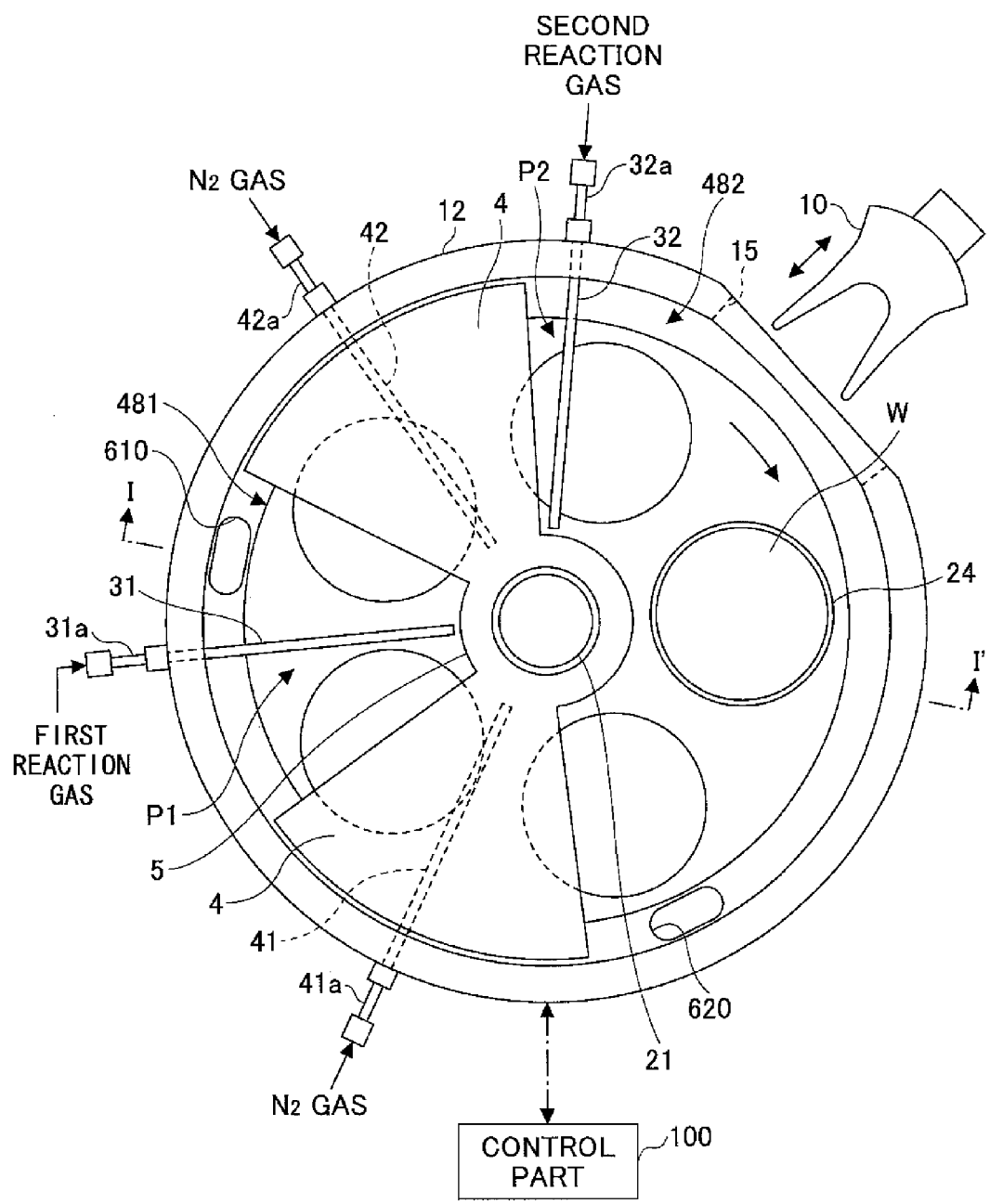
FIG. 3 is a schematic top view illustrating a structure of the vacuum chamber of the film deposition apparatus in FIG. 1.

With reference to FIGS. 1 through 3, the film deposition apparatus includes a vacuum chamber 1 whose planar shape is an approximately round shape, and a turntable 2 provided in the vacuum chamber 1 and having a center of the rotation that coincides with the center of the vacuum chamber 1. The vacuum chamber 1 includes a chamber body 12 having a cylindrical shape with a bottom, and a ceiling plate 11 hermetically arranged on an upper surface of the chamber body 12 to be attachable to or detachable from the chamber body 12 through a seal member 13 (see FIG. 1) such as an O-ring.

The turntable 2 is fixed to a core portion 21 having a cylindrical shape at the center portion, and the core portion 21 is fixed to an upper end of a rotational shaft 22 that extends in a vertical direction. The rotational shaft 22 penetrates through a bottom part 14 of the vacuum chamber 1, and the lower end is attached to a drive part 23 that rotates the rotational shaft 22 (see FIG. 1) around the vertical axis. The rotational shaft 22 and the drive part 23 are housed in a cylindrical case body 20 whose upper surface is open. A flange part provided on the upper surface of this case body 20 is hermetically attached to the lower surface of a bottom part 14 of the vacuum chamber 1, by which the internal atmosphere of the case body 20 is separated from the external atmosphere.

As shown in FIGS. 2 and 3, a plurality of circular shaped concave portions 24 is provided to allow a plurality of (five in an example of FIG. 3) semiconductor wafers (which is hereinafter called "a wafer or wafers") to be disposed along a rotational direction (i.e., a circumferential direction) W. In FIG. 3, the wafer W is shown in a single concave portion 24 for convenience. This concave portion 24 has an inner diameter that is slightly greater, for example, 4 mm, than a diameter of the wafer W (e.g., 300 mm), and a depth approximately equal to a thickness of the wafer. Accordingly, when the wafer W is placed on the concave portion 24, the surface of the wafer W and the surface of the turntable 2 (which means an area where the wafer is not placed) have the same height.

FIGS. 2 and 3 are views for illustrating a structure in the vacuum chamber 1, and the ceiling plate 1 is removed therefrom for convenience of explanation. As shown in FIGS. 2 and 3, a reaction gas nozzle 31, a reaction gas nozzle 32, and separation gas nozzles 41 and 42 that are respectively made of, for example, quartz, are arranged above the turntable 2. In the example shown in FIGS. 2 and 3, the separation gas nozzle 41, the reaction gas nozzle 31, the separation gas nozzle 42, and the reaction gas nozzle 32 are arranged in this order from a transfer opening 15 (which is described below) in a clockwise fashion (i.e., rotational direction of the turntable 2) at intervals in a rotational direction of the vacuum chamber 1. These nozzles 31, 32, 41 and 42 are introduced into the vacuum chamber 1 from an external wall by fixing gas introduction ports 31a, 32a, 41a and 42a that are base end portions of the respective nozzles 31, 32, 41 and 42 to the external wall of the chamber body 12 (see FIG. 3), and are installed to extend along the radial direction of the chamber body 12 and parallel to the turntable 2.

The reaction gas nozzle 31 is connected to a first reaction gas supply source storing a first reaction gas, through an on-off valve and a flow controller (both of which are not shown in the drawing). The reaction gas nozzle 32 is connected to a second reaction gas supply source reserving a second reaction gas that reacts with the first reaction gas, through an on-off valve and a flow controller (both of which are not shown in the drawing).

Here, the first reaction gas is preferably a gas containing a metal element (or a semiconductor element), and the second reaction gas is preferably a gas that can react with a metal element (or a semiconductor element) and can produce a metal compound (or semiconductor compound). More specifically, the first reaction gas is further preferably an organic metal (or a semiconductor) gas containing a metal element (or a semiconductor element). Furthermore, the first reaction gas is preferably an adsorptive gas to adsorb on the surface of the wafer W, and the second reaction gas is preferably a gas that can react with the first reaction gas adsorbed on the surface of the wafer W and can deposit the reaction compound on the surface of the wafer W.

Moreover, the separation gas nozzle 41 and 42 are connected to a source of an inert gas such as a noble gas including Ar or He or the like, or an $N_2$ gas, through an on-off valve and a flow controller (both of which are not shown in the drawing). In the present embodiment, the $N_2$ gas is used as the inert gas.

The reaction gas nozzles 31 and 32 include a plurality of gas discharge holes 33 that are open downward facing the turntable 2 (see FIG. 4) and are arranged along the length direction of the reaction gas nozzles 31 and 32 at intervals of, for example, 10 mm. An area under the reaction gas nozzle 31 is a first process area P1 to adsorb the first reaction gas on the wafer W. An area under the reaction gas nozzle 32 is a second process area P2 to oxidize the first reaction gas adsorbed on the wafer W in the first process area P1.

Figure 4:
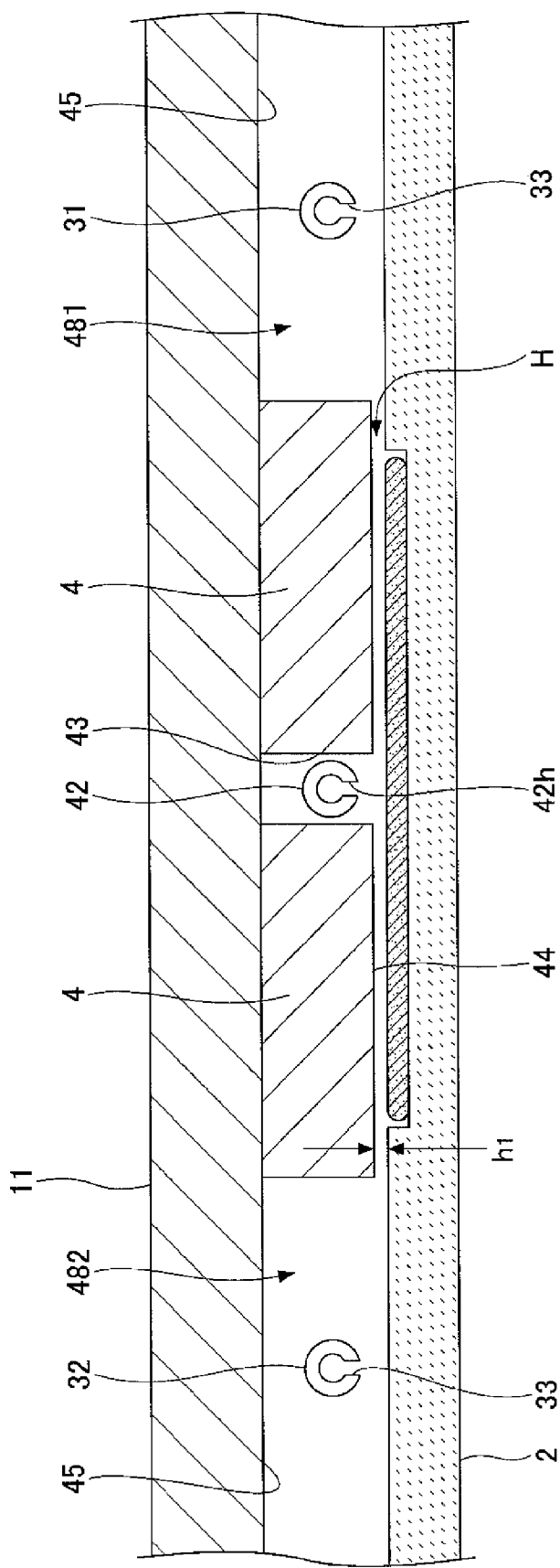
FIG. 4 is a partial cross-sectional view of the film deposition apparatus in FIG. 1.

With reference to FIGS. 2 and 3, two convex portions 4 are provided in the vacuum chamber 1. The convex portions 4 have an approximately sectorial planar shape whose apex is cut in an arc-like form. In the present embodiment, the inner arc is coupled to a protrusion portion 5 (which is described below), and the outer arc is arranged so as to be along an inner periphery of the chamber body 12 of the vacuum chamber 1. FIG. 4 shows a cross-section of the vacuum chamber 1 along a concentric circle of the turntable 2 from the first reaction nozzle 31 to the second reaction nozzle 32. As shown in FIG.

4, the convex portion 4 is attached to the back surface of the ceiling plate 11. Because of this, in the vacuum chamber 1, there are a low ceiling surface 44 (i.e., first ceiling surface) that is a lower surface of the convex portion 4, and a high ceiling surface 45 (i.e., second ceiling surface) higher than the ceiling surface 44 and located on both sides of the ceiling surface 44 in the circumferential direction.

In addition, as shown in FIG. 4, a groove 43 is formed in the convex portion 4 at the center in the circumferential direction, and the groove portion 43 extends along a radial direction of the turntable 2. The groove portion 43 houses the separation gas nozzle 42. The groove portion 43 is also formed in the other convex portion 4 in a similar way, and the separation gas nozzle 41 is housed therein. A plurality of gas discharge holes 42h is formed in the separation gas nozzle 42. The plurality of gas discharge holes 42h is formed along the length direction of the separation gas nozzle 42 at predetermined intervals (e.g., 10 mm). An opening size of the plurality of gas discharge holes 42h is, for example, 0.3 to 1.0 mm. Although an illustration is omitted, the plurality of gas discharge holes 42h is similarly formed in the separation gas nozzle 41.

The reaction gas nozzles 31 and 32 are respectively provided in areas under the high ceiling surfaces 45. These reaction gas nozzles 31 and 32 are provided in the vicinity of the wafer W away from the ceiling surfaces 45. For convenience of explanation, as shown in FIG. 4, a space under the high ceiling surface 45 including the reaction gas nozzle 31 is shown by a numeral 481, and a space under the high ceiling surface 45 including the reaction gas nozzle 32 is shown by a numeral 482.

The low ceiling surface 44 forms a separation space H of a narrow space relative to the turntable 2. When the separation gas nozzle 42 supplies an $N_2$ gas, the $N_2$ gas flows to the spaces 481 and 482 through the separation space H. At this time, because a volume of the separation space is smaller than that of the spaces 481 and 482, a pressure of the separation space H can be higher than that of the spaces 481 and 482 by the $N_2$ gas. In other words, the separation space H provides a pressure barrier between the spaces 481 and 482. Furthermore, the $N_2$ gas flowing from the separation space H to the spaces 481 and 482 works as a counter flow against the first reaction gas from the first process area P1 and the second reaction gas from the second process area P2. Accordingly, the first reaction gas from the first process area and the second reaction gas from the second process area P2 are separated by the separation space H. Hence, a mixture and a reaction of the first reaction gas and the second reaction gas in the vacuum chamber 1 are reduced.

A height h1 of the ceiling surface 44 relative to the upper surface of the turntable 2 is preferably set at an appropriate height to make the pressure of the separate space H higher than the pressure of the spaces 481 and 482, considering the pressure in the vacuum chamber 1, a rotational speed of the turntable 2, and a supply amount of the separation gas (i.e., $N_2$ gas) to be supplied.

With reference to FIGS. 2 and 3 again, the protrusion portion 5 is provided so as to surround an outer circumference of the core portion 21 that fixes the turntable 2 on the lower surface of the ceiling plate 11. In the present embodiment, this protrusion portion 5 continuously extends to a region on the rotational center side of the convex portion 4, and the lower surface of the protrusion portion 5 is formed to be the same height as the ceiling surface 44.

Figure 5:
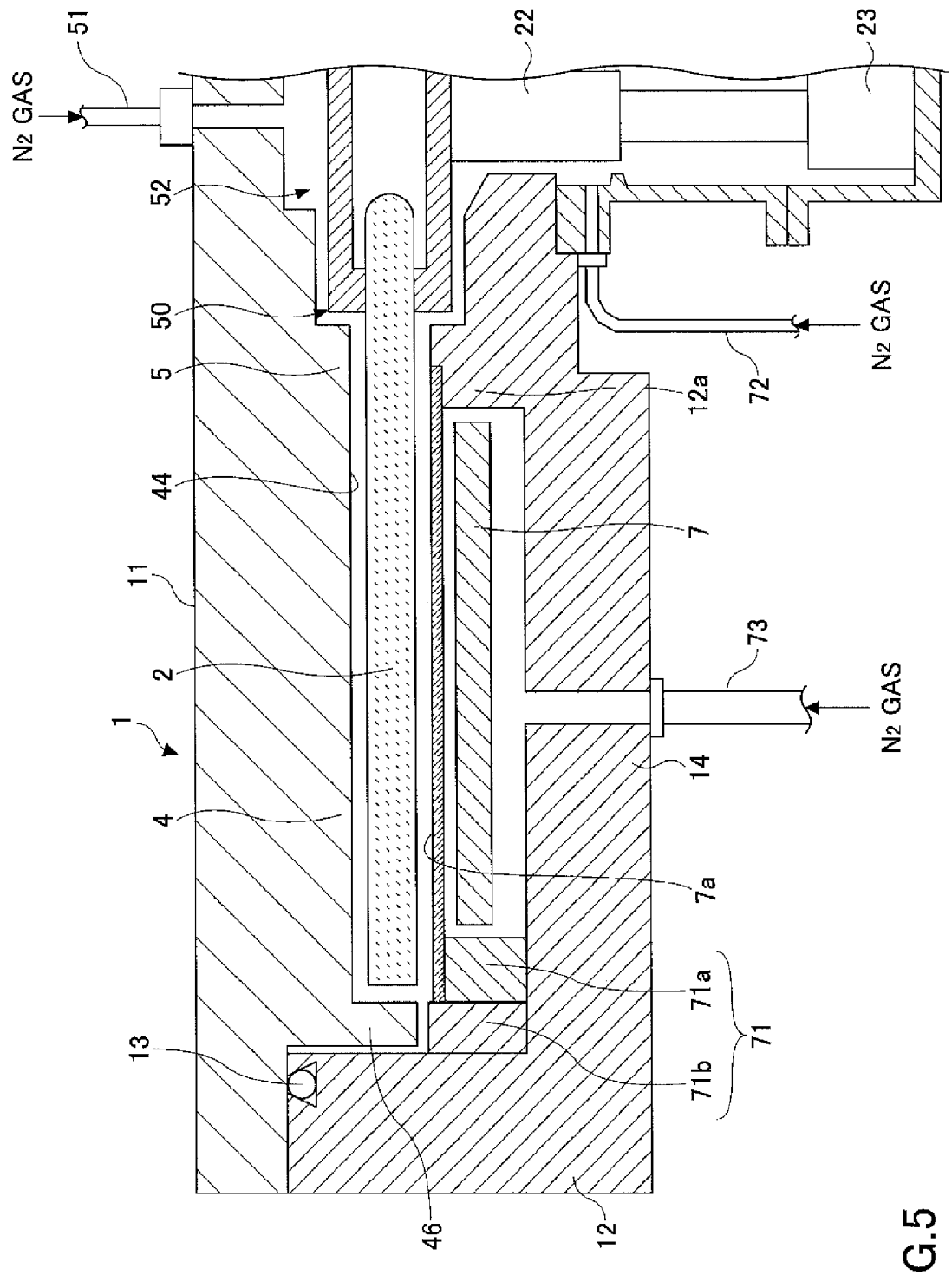
FIG. 5 is a partial cross-sectional view of another part of the film deposition apparatus in FIG. 1.

Previously referred to FIG. 1 is a cross-sectional view along an I-I' line in FIG. 3, and shows an area where the ceiling surface 45 is provided. On the other hand, FIG. 5 is a partial cross-sectional view illustrating an area where the ceiling surface 44 is provided. As shown in FIG. 5, a bent portion 46 that is bent into an L-letter shape is formed in a periphery of the approximately sectorial convex portion 4 (i.e., a region on the outer edge of the vacuum chamber 1) so as to face the outer edge surface of the turntable 2. The bent portion 46 prevents a gas from circulating between the spaces 481 and 482 through a space between the turntable 2 and the inner periphery of the chamber body 12. Because the sectorial convex portion 4 is provided on the ceiling plate 11, and the ceiling plate 11 is detachable from the chamber body 12, there is a slight gap between the outer periphery of the bent portion 46 and the inner periphery of the chamber body 12. A gap between the inner periphery of the bent portion 46 and the outer edge surface of the turntable 2, and the gap between the outer periphery of the bent portion 46 and the inner periphery of the chamber body are, for example, set at a size similar to a height of the ceiling surface 44 relative to the upper surface of the turntable 2.

With reference to FIG. 3 again, a first evacuation opening 610 in communication with the space 481 and a second evacuation opening 620 in communication with the space 482 are formed between the turntable 2 and the inner periphery of the chamber body 12. As shown in FIG. 1, the first evacuation opening 610 and the second evacuation opening 620 are connected to, for example, vacuum pumps 640 of a evacuation unit through respective evacuation pipes 630. FIG. 1 also shows a pressure adjustor 650.

As shown in FIGS. 1 and 5, a heater unit 7 that is a heating unit is provided in a space between the turntable 2 and the bottom part 14 of the vacuum chamber 1, and the wafer W on the turntable 2 is heated up to a temperature determined by a process recipe (e.g., 450 degrees) through the turntable 2. A ring-shaped cover member 71 is provided on the lower side of the periphery of the turntable 2 to prevent a gas from intruding into a space under the turntable 2. As shown in FIG. 5, the cover member 71 includes an inner member 71a provided so as to face the outer edge portion of the turntable 2 and a further outer portion from the lower side, and an outer member 71b provided between the inner member 71a and the inner wall surface of the vacuum chamber 1. The outer member 71b is provided under the bent portion 46 formed in the outer edge portion of the convex portion 4 and close to the bent portion 46, and the inner member 71a is provided to surround the heater unit 7 through the whole circumference under the outer edge portion of the turntable 2 (and the slightly further outer portion).

As shown in FIG. 1, the bottom part 14 in a region closer to the rotational center than the space where the heater unit 7 is arranged forms a protrusion part 12a so as to get closer to the core portion 21 in the center portion of the lower surface of the turntable 2. A gap between the protrusion part 12a and the core portion 21 forms a narrow space. Moreover, a gap between an inner periphery of a through-hole of the rotational shaft 22 that penetrates through the bottom part 14 and the rotational shaft 22 is narrow, and the narrow space is communication with the case body 20. The case body 20 includes a purge gas supply pipe 72 to supply the $N_2$ gas as a purge gas to the narrow space for a purge. Furthermore, a plurality of purge gas supply pipes 73 is provided at predetermined angular intervals in the circumferential direction under the heater unit 7 to purge the arrangement space of the heater unit 7 (only a single purge gas supply pipe 73 is shown in FIG. 5). In addition, a lid member 7a that covers from the inner peripheral wall of the outer member 71b (i.e., the upper surface of the inner member 71a) to the upper end of the protrusion part 12a through the circumferential direction is provided between the heater unit 7 and the turntable 2 to prevent the gas from entering the area including the heater unit 7. The lid member 7a may be made of, for example, quartz.

When the purge gas supply pipe 72 supplies an $N_2$ gas, this $N_2$ gas flows through the gap between the inner periphery of the through-hole and the rotational shaft 22, the gap between the protrusion part 12a and the core portion 21 and the space between the turntable 2 and the lid member 7a, and is evacuated from the first evacuation opening 610 or the second evacuation opening 620 (see FIG. 3). Moreover, when the purge gas supply pipe 72 supplies an $N_2$ gas, the $N_2$ gas flows out from the space including the heater unit 7 through a gap between the lid member 7a and the inner member 71a (not shown in the drawing), and is evacuated from the first evacuation opening 610 or the second evacuation opening 620 (see FIG. 3). The flows of the $N_2$ gas can prevent the gases in the space 481 and 482 from being mixed through the space around the center and on the lower side of the vacuum chamber 1, and through the space under the turntable 2.

Furthermore, a separation gas supply pipe 51 is connected to the central part of the ceiling plate 11 of the vacuum chamber 1, and is configured to supply an $N_2$ gas of the separation gas to a space 52 between the ceiling plate 11 and the core portion 21. The separation gas supplied to the space 52 is discharged toward the outer edge through a narrow space 50 between the protrusion portion 5 and the turntable 2, and along the surface of the turntable 2 on the wafer receiving area side. The space 50 can be maintained at a higher pressure than that of the spaces 481 and 482 by the separation gas.

Accordingly, the space 50 serves to prevent the first reaction gas supplied to the first process area P1 and the second reaction gas supplied to the second process area P2 from being mixed through the center area C. In other words, the space 50 (or the center area C) can function as well as the separation space H (or the separation area D).

In addition, as shown in FIGS. 2 and 3, the transfer opening 15 is formed in the side wall of the vacuum chamber 1 to transfer the wafer W, which is the substrates, between the outer transfer arm 10 and the turntable 2. The transfer opening 15 is configured to be hermetically openable and closeable by a gate valve not shown in FIGS. 2 and 3. Moreover, the wafer W is transferred between the concave portions 24, which are the wafer receiving areas in the turntable 2, and the transfer arm 10 at a position where one of the concave portions 24 faces the transfer opening 15. Accordingly, lift pins for transfer to lift up the wafer W from the back side by penetrating through the concave portion 24 and the lifting mechanism (none of which are shown in the drawing) are provided at the position corresponding to the transfer position under the turntable 2.

Moreover, as shown in FIG. 1, a control part 100 constituted of a computer to control operations of the whole apparatus is provided in this film deposition apparatus, and a program to implement a film deposition process described below is stored in a memory of the control part 100. This program is constituted of instructions of step groups to cause the apparatus to implement respective operations of the apparatus, and is installed from a memory part 101 of a recording medium 102 such as a hard disk, a compact disc, a magnetic optical disc, a memory card and a flexible disc into the control part 100.

<Film Deposition Method>

Next, a description is given of a film deposition method according to an embodiment of the present invention, with reference to FIG. 6 in addition to the drawings referred above, taking a case of being practiced by using the above-mentioned film deposition apparatus for example.

First, the gate valve G is opened, and a wafer W is transferred onto the concave portion 24 of the turntable 2 through the transfer opening 15 by the transfer arm 10. This transfer is performed by allowing the lift pins not shown in the drawings to lift up and down from the bottom side of the vacuum chamber 1 through the through-holes of the bottom surface of the concave portion 24 when the concave portion 24 is stopped at a position opposite to the transfer opening 15. Such a transfer of the wafers W is performed, while rotating the turntable 2 intermittently, and the wafers W are placed in the five concave portions 24 of the turntable 2.

Next, the gate valve G is closed, and the vacuum chamber 1 is evacuated by the vacuum pump 640 up to a minimum degree of vacuum. After that, the separation gas nozzles 41 and 42 supply an $N_2$ gas of the separation gas at a predetermined flow rate, and the separation gas supply pipe 51 and the purge gas supply pipe 72 and 73 also supply an $N_2$ gas of the separation gas at a predetermined flow rate. In response to this, the pressure adjustor 650 adjusts the pressure in the vacuum chamber 1 to be a preliminarily set process pressure. Next, the wafer W is heated, for example, to become a temperature in a range from 250 degrees to 650 degrees by the heater unit 7, while rotating the turntable 2 in a clockwise fashion at a rotational speed of, for example, at most 240 rpm.

Subsequently, the first process gas nozzle 31 supplies a first reaction gas, and the second process gas nozzle 32 supplies a second reaction gas. In other words, as shown in FIGS. 6A and 6B, the first reaction gas and the second reaction gas are supplied at the same time. However, these gases are separated by the separation space H (see FIG. 4), and hardly mix with each other.

When the first reaction gas and the second reaction gas are simultaneously supplied, the first reaction gas is adsorbed on a surface of the wafer W while the wafer W passes through the first process area P1 by the rotation of the wafer W, and the second reaction gas reacts with the first reaction gas adsorbed on the surface of the wafer W while the wafer W passes through the second process area P2, by which a thin film made of a reaction product is deposited on the surface of the wafer W.

Next, as shown in FIGS. 6A and 6C, the reaction gas nozzle 31 stops supplying the first reaction gas, and the reaction gas nozzle 32 continues to supply the second reaction gas. At this time, the reaction gas nozzle 31 may supply a noble gas such as Ar or He, or an inert gas such as an $N_2$ gas. For example, to reduce a backward flow of the gas to the reaction gas nozzle 31, an $N_2$ gas of about 100 sccm may be flown from the reaction gas nozzle 31. Here, the separation gas nozzles 41 and 42, the separation gas supply pipe 51 and the purge gas supply 7 pipes 72 and 73 continuously supply the $N_2$ gas (the same applies hereinafter).

The wafer W having reached the second process area P2 (the area under the reaction gas nozzle 32) by the rotation of the turntable 2 is exposed to the second reaction gas here. After that, by continuing the rotation of the turntable 2, the wafer W passes through the separation area D, the first process area P1 and the separation area D, reaches the second process area P2 again, and is exposed to the second reaction gas.

After a predetermined time has passed, while the reaction gas nozzle 32 supplies the second reaction gas, the reaction gas nozzle 31 supplies the first reaction gas nozzle again. By doing this, as shown in FIGS. 6A and 6B, the first reaction gas and the second reaction gas are simultaneously supplied. Sequentially, by intermittently repeating the stop and supply of the first reaction gas, a thin film having a desired thickness is deposited on the wafer W. After that, the supply of the gases to the vacuum chamber is stopped; the rotation of the turntable 2 is stopped; and the wafer W is carried out of the vacuum chamber 1 by the reverse sequence to the sequence of carrying the wafer W in the vacuum chamber 1. Then the film deposition process is finished.

In this manner, according to the film deposition method of the embodiment of the present invention, by rotating the turntable 2 while supplying the first reaction gas and the second reaction gas at the same time, after repeating the cycle of the adsorption of the first reaction gas on the surface of the wafer W and the reaction of the second reaction gas with the first reaction gas adsorbed on the wafer W, the supply of the first reaction gas is stopped, and the surface of the wafer W is exposed to the second reaction gas. This enables the first reaction gas remaining on the surface of the wafer W without reacting with the second reaction gas though being adsorbed on the surface of the wafer W to react with the second gas sufficiently. This can prevent the first reaction gas from being incorporated into the thin film remaining unreacted, which can improve the quality of the thin film.

Next, a description is given of a working example of a film deposition method according to the present embodiment. In the present working example, Tetrakis(ethylmethylamino) zirconium (TEMAZ), one of Zr-containing organic metal gases, was used as the first reaction gas, and an ozone gas was used as the second reaction gas. By using these, a zirconium oxide (ZrO) film was deposited on a wafer W. The ozone gas was obtained by connecting an oxide gas supply source (not shown in the drawings) to the reaction gas nozzle 32 via an ozonizer (not shown in the drawings), and by ozonizing the oxide from the oxide gas supply source by the ozonizer. Major conditions are as indicated below.

Temperature of Wafer W: 300 degrees
Supply Amount of TEMAZ: 0.4 cc/min (as a liquid)
Supply Amount of Ozone: 300 g/Nm$^3$ (supply amount of oxide gas is 10 slm)
Supply Amount of Separation Gas (respective supply amount from separation gas nozzles 41 and 42): 10 slm.

Moreover, with respect to the TEMAZ as the first reaction gas, the total of a supplying time and a stopping time was set at 10 seconds, and the film deposition was performed by setting the supplying time at 2.5 seconds (the stopping time is 7.5 seconds), 2 seconds (the stopping time is 8 seconds) and 1 second (the stopping time is 9 seconds) of three patterns. Furthermore, the rotational speed of the turntable 2 was set at the same irrespective of the supplying time of the TEMAZ, and was adjusted so that all of the wafers W on the turntable 2 pass the first process area P1 (the area under the reaction gas nozzle 31) when the supplying time is 1 second.

As a comparative example, a ZrO film was deposited by simultaneously supplying the TEMAZ and the ozone gas without stopping the supply of the TEMAZ (which corresponds to 10 seconds of the supplying time).

Figure 7:
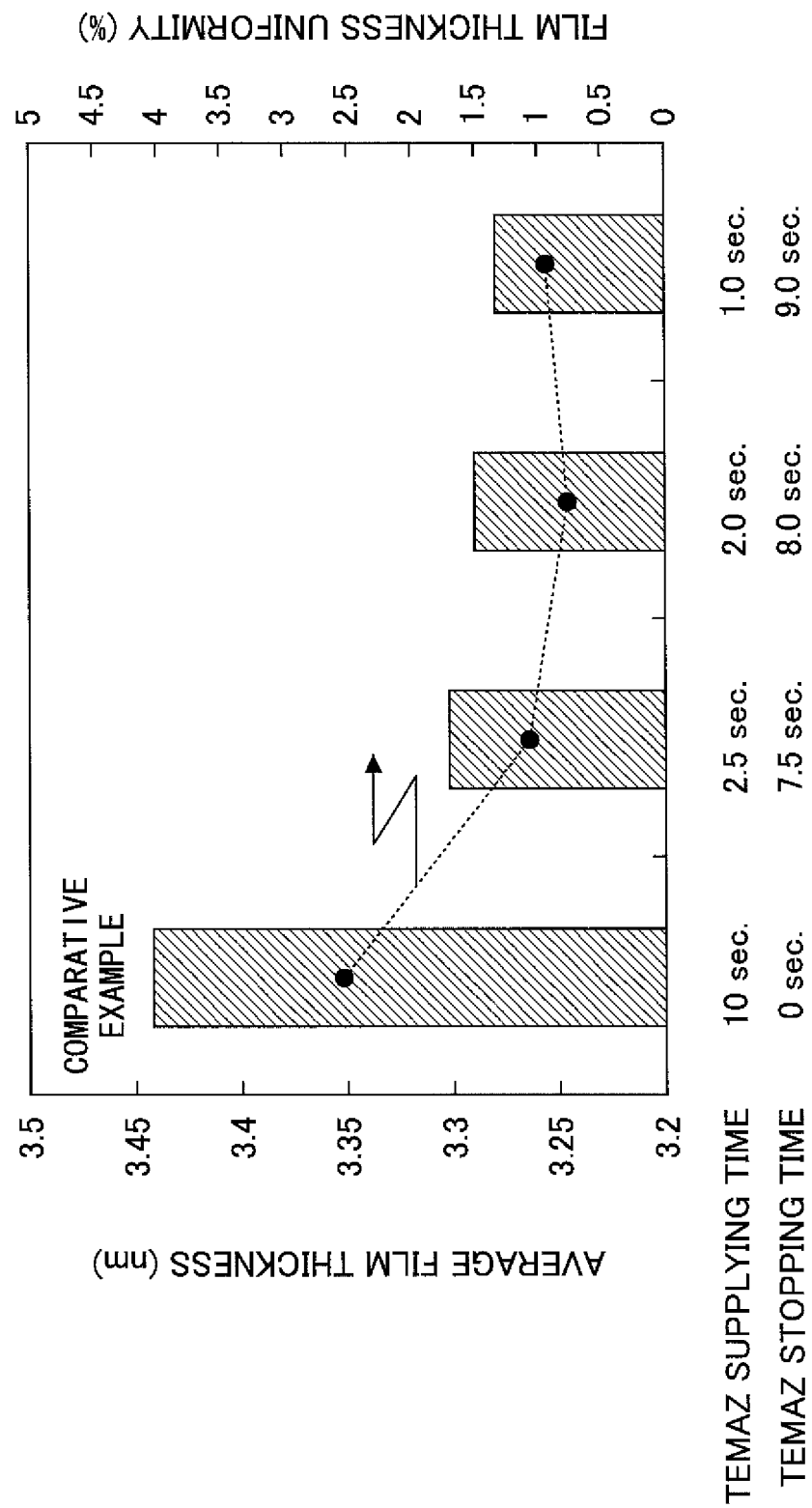
FIG. 7 is a graph showing an average film thickness and a film thickness uniformity of a zirconium oxide film deposited by a working example of the present invention.

FIG. 7 shows results of an average film thickness and film thickness uniformity within the wafer surface of the ZrO film obtained by doing the above. In FIG. 7, a line graph shows the average film thickness, and a bar graph shows the film thickness uniformity. With reference to FIG. 7, it is noted that the average film thickness in the present working example was smaller than that of the comparative example to a certain degree (see the line graph). With respect to the film thickness uniformity, a sufficiently favorable result was obtained even in the comparative example, but a further favorable result was obtained in the working example, and more specifically, the result was less than a half of the result of the comparative example (see the bar graph). In the comparative example, because the TEMAZ and the ozone gas were always supplied during the deposition process, and the wafers were alternately exposed to the TEMAZ and the ozone gas, oxidation of the TEMAZ adsorbed on the surface of the wafers could have been insufficient, and the film thickness uniformity could have been decreased. By contrast, in the working example, because the TEMAZ adsorbed on the surface of the wafers was sufficiently oxidized while stopping the supply of the TEMAZ, it is thought that the film thickness uniformity was improved, and that the film of a favorable film quality with a low impurity concentration was obtained.

All examples recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that various changes, substitutions, and alterations could be made hereto without departing from the spirit and scope of the invention.

For example, the supply of the second reaction gas may be stopped together with the stop of supplying the first reaction gas, and the second reaction gas may be supplied after a predetermined time passes.

In addition, the present invention is not limited to the film deposition of the ZrO film by the above-mentioned combination of the TEMAZ and the ozone gas, but, for example, can be applied to the following combinations.

(1) A film deposition of an aluminum oxide film by a combination of Trimethylaluminum (TMA) and an ozone gas,
(2) A film deposition of a hafnium oxide film by a combination of Tetrakis(ethylmethylamino)hafnium (TEMAH) and an ozone gas,
(3) A film deposition of a strontium oxide film by a combination of Strontiumbis-tetramethylheptanedionato (Sr(THD)$_2$) and an ozone gas,
(4) A film deposition of a titanium oxide film by a combination of Titaniummethylpentanedionatobis-tetramethylheptanedio nato (Ti(MPD) (THD)) and an ozone gas,
(5) A film deposition of a silicon oxide film by a combination of Bis(tertiary-butylaminosilane) (BTBAS) and an ozone gas, and
(6) A film deposition of a silicon oxide film by a combination of an organic aminosilane gas and an ozone gas.

In the above, instead of the ozone gas generated by the ozonizer, an oxide gas activated by plasma by using remote plasma (which can include an oxide radical and an oxide ion) may be used.

Moreover, the film deposition method of the present invention can be applied to a film deposition of a silicon nitride film using a predetermined nitridization gas.

As described above, according to embodiments of the present invention, in a film deposition method that alternately supplies at least two kinds of reaction gases that react with each other onto a substrate, thereby depositing a reaction product of the two kinds of gases on the substrate, a film deposition method that can react the two kinds of gases sufficiently is provided.

What is claimed is:
1. A film deposition method using a film deposition apparatus, the film deposition apparatus including:
   a turntable rotatably provided in a vacuum chamber, the turntable including a substrate loading area in an upper surface to hold a substrate thereon;

a first gas supply part arranged in a first process area zoned above the upper surface of the turntable and configured to supply a gas onto the upper surface of the turntable;

a second gas supply part arranged in a second process area distanced from the first process area along a circumferential direction of the turntable and configured to supply a gas onto the upper surface of the turntable;

a separation gas supply part provided between the first process area and the second process area in the vacuum chamber and configured to supply a separation gas onto the upper surface of the turntable; and a separation area including a ceiling surface configured to form a narrow space relative to the upper surface of the turntable in order to introduce the separation gas from the separation gas supply part to the first process area and the second process area, the ceiling surface having a width along the circumferential direction of the turntable, the width broadening with distance from the center of the turntable in a radial direction of the turntable, the film deposition method comprising steps of:

depositing a zirconium oxide film by supplying a first reaction gas of tetrakis (ethylmethylamino) zirconium from the first gas supply part to the first process area, and supplying a second reaction gas of ozone capable of reacting with the first reaction gas from the second gas supply part of an ozonizer to the second process area, while rotating the turntable and supplying the separation gas from the separation gas part to separate the first process area and the second process area from each other; and improving film thickness uniformity of the zirconium oxide film by supplying the second reaction gas from the second gas supply part without supplying the first reaction gas from the first gas supply part for a predetermined period, while rotating the turntable and supplying the separation gas from the separation gas part to separate the first process area and the second process area from each other, said step of improving film thickness uniformity of the zirconium oxide film being conducted for a duration of at least 7.5 seconds without activating plasma, wherein said first reaction gas is supplied into the vacuum chamber only during the step of depositing the zirconium oxide film while said second reaction gas is supplied into the vacuum chamber continuously throughout the step of depositing the zirconium oxide film and the step of improving film thickness uniformity of the zirconium oxide film.

2. The method as claimed in claim 1, wherein said step of improving is continued for a duration of 8.0 seconds or more.

3. The method as claimed in claim 1, wherein said step of improving are conducted at a temperature of 300° C.

* * * * *